(12) United States Patent
Chang

(10) Patent No.: US 7,129,636 B2
(45) Date of Patent: Oct. 31, 2006

(54) ACTIVE MATRIX ORGANIC ELECTROLUMINESCENT DEVICE AND FABRICATION METHOD THEREOF

(75) Inventor: Yi-Chen Chang, Taipei (TW)

(73) Assignee: AU Optronics Corp., Hsinchu (TW)

( * ) Notice: Subject to any disclaimer, the term of this patent is extended or adjusted under 35 U.S.C. 154(b) by 285 days.

(21) Appl. No.: 10/859,003

(22) Filed: Jun. 2, 2004

(65) Prior Publication Data

US 2005/0218798 A1    Oct. 6, 2005

(30) Foreign Application Priority Data

Mar. 30, 2004    (CN) .............................. 93 1 08643

(51) Int. Cl.
*H01J 1/62* (2006.01)
(52) U.S. Cl. ...................... 313/506; 313/504
(58) Field of Classification Search ................ 313/498, 313/499, 503, 504, 506, 509, 512
See application file for complete search history.

(56) References Cited

U.S. PATENT DOCUMENTS 5,144,473 A * 9/1992 Gemma et al. ............. 359/270
6,777,309 B1 * 8/2004 Liao et al. .................. 438/458

* cited by examiner

*Primary Examiner*—Vip Patel
(74) *Attorney, Agent, or Firm*—Thomas, Kayden, Horstemeyer & Risley

(57) ABSTRACT

An active matrix organic electroluminescent device with a thermal insulation structure and fabrication method thereof. The active matrix organic electroluminescent device comprises a plurality of pixel areas arranged in a matrix form. Each pixel area comprises a TFT, an OLED and a thermal insulation structure formed between the OLED and the TFT. The thermal insulation structure insulates the OLED from the heat generated by the TFT under operation, resulting in high luminescent efficiency and extended lifetime of the device.

21 Claims, 8 Drawing Sheets
(1 of 8 Drawing Sheet(s) Filed in Color)

ACTIVE MATRIX ORGANIC ELECTROLUMINESCENT DEVICE AND FABRICATION METHOD THEREOF

BACKGROUND OF THE INVENTION

1. Field of the Invention

The present invention relates to an active matrix organic electroluminescent device and, more particularly, to an active matrix organic electroluminescent device with a thermal insulation structure.

2. Description of the Related Art

Recently, with the development and wide application of electronic products, such as mobile phones, PDA, and notebook computers, there has been increasing demand for flat display devices which consume less electric power and occupy less space. Among flat panel displays, organic electroluminescent devices are self-emitting and highly luminous, with wider viewing angle, faster response speed, and a simple fabrication process, making them the industry display of choice.

An organic light-emitting diode (OLED) is a light-emitting diode that uses an organic electroluminescent layer as the increasingly gradually employed in flat panel displays. In accordance with driving methods, an OLED is an active matrix type (AM-OLED) or a positive matrix type (PM-OLED).

Conventionally, it is known that a positive matrix organic electroluminescent device is driven by XY matrix electrodes to display an image, employing sequential line drive. Therefore, if the number of scanning lines is in the hundreds, required instantaneous brightness is several hundred times larger than observed brightness so that electrical current passed instantaneously becomes several-hundred times larger and extreme heat is generated resulting in increasing the operating temperature of organic electroluminescent layers. However, since the aging rate of organic electroluminescent layers is in direct ratio to operating temperature thereof, the luminescent efficiency and lifetime of the organic electroluminescent device are thereby adversely affected.

The trend in organic electroluminescent display technology is for higher luminescent efficiency and longer lifetime. As a result, an active matrix organic electroluminescent device with thin film transistors is provided to solve the aforementioned problems. The active matrix organic electroluminescent device has panel luminescence with thin and lightweight characteristics, spontaneous luminescence with high luminescent efficiency and low driving voltage, and advantages of increased viewing angle, high contrast, high-response speed, flexibility and full color. As the need for larger size display devices with higher resolution grows, active matrix organic electroluminescent devices look to achieve a major market trend.

FIG. 1 is a schematic top view of a conventional active matrix organic electroluminescent device. The active matrix organic electroluminescent device comprises a plurality of pixel areas 10 arranged in a matrix form that are constituted by a plurality of data lines 12 extending along a Y direction and a plurality of source lines 14 extending along an X direction. Also, each pixel area 10 comprises two thin film transistors (TFTs) 11 and 13, a capacitor 15, an OLED 17, and two scanning lines 16 extending along the X direction.

FIG. 2 is a sectional diagram of FIG. 1 along line A–A' showing the TFT 13 and the OLED 17. First, the TFT 13 is formed on a transparent substrate 5, wherein the TFT 13 comprises a gate electrode 31, a gate insulation layer 32, an amorphous silicon layer 33, a doped amorphous silicon layer 34, a source electrode 36, a drain electrode 35 and a silicon nitride layer 37. Next, a patterned transparent electrode 21 is formed on the transparent substrate 5, and an organic electroluminescent layer 23 and an aluminum electrode 25 are blanketly formed on the above.

The described active matrix organic electroluminescent device reduces the amount of electrical current passing the OLED 17 to prevent the organic electroluminescent layers 23 from aging from high operating temperature. However, since the active matrix organic electroluminescent device employs TFTs as driving circuits, the massive electrical current flows through the amorphous silicon layer 33 serving as a channel. A significant amount of heat is generated by the resistance of the amorphous silicon layer 33, and the operating temperature of the OLED 17 is raised by thermal conduction through the aluminum electrode 25.

FIG. 3 is a graph plotting electrical current stability against time at different operating temperatures of a common TFT. According to FIG. 3, the lifetime of TFT is unaffected by operating temperature under 50~80° C. FIG. 4 is a graph plotting brightness against voltage at different operating temperatures of a common OLED. The luminescent efficiency of the OLED is significantly affected by increased operating temperature. High operating temperature of OLED results in accelerated aging rate of organic electroluminescent layers, and the luminescent efficiency and lifetime thereof are both lowered.

Therefore, it is necessary to develop a simple and efficient manufacturing method and structure for an active matrix organic electroluminescent device to prevent an OLED from being affected by the heat generated by a TFT.

SUMMARY OF THE INVENTION

Accordingly, an object of the present invention is to provide an active matrix organic electroluminescent device with a thermal insulation structure, solving the aforementioned problems, without process complexity increasing. The active matrix organic electroluminescent devices according to the present invention can meet the demands of the flat panel display market, due to the increased stability, high luminescent efficiency and extended lifetime.

Another object of the present invention is to provide a method for fabricating active matrix organic electroluminescent devices with a thermal insulation structure.

To achieve the above objects, according to the present invention, an active matrix organic electroluminescent device with a thermal insulation structure comprises a plurality of pixel areas arranged in a matrix form. Each pixel area comprises a TFT and an OLED formed on a substrate, wherein the TFT comprises a semiconductor layer, a doped semiconductor layer, a gate electrode, a source electrode, and a drain electrode. The OLED comprises a first electrode, an organic electroluminescent layer, and a second electrode, wherein the second electrode extends to connect with an adjacent second electrode of an adjacent organic light-emitting diode. Also, the pixel area comprises a thermal insulation structure formed in the second electrode between the OLED and the semiconductor layer of TFT.

The present invention also provides another active matrix organic electroluminescent device with a thermal insulation structure, comprising a plurality of pixel areas arranged in a matrix form. Each pixel area comprises a TFT and an insulation layer formed on a substrate, a first electrode formed on the insulation layer, a protective layer formed on the TFT and a part of the first electrode, and an organic electroluminescent layer and a second electrode sequentially formed over the substrate to cover the first electrode and the protective layer, wherein the TFT comprises a semiconductor layer, a doped semiconductor layer, a gate electrode, a source electrode, and a drain electrode. The first electrode, and the organic electroluminescent layer and second electrode thereupon comprise an OLED. Also, the pixel area comprises a thermal insulation structure formed in the second electrode between the OLED and the semiconductor layer of TFT.

According to the present invention, the pixel area further comprises a light-shielding layer formed on the protective layer to cover the semiconductor layer. Moreover, the thermal insulation structure comprises a thermal insulation trench and thermal insulation materials filled into the thermal insulation trench. The thermal insulation structure can be further formed in the organic electroluminescent layer between the OLED and the semiconductor layer of TFT.

In the present invention, the substrate employed in the organic electroluminescent device can be transparent or opaque. The organic electroluminescent device can be a bottom-emission, top-emission, or dual emission organic electroluminescent device.

To achieve another object of the present invention, the present invention also provides a method for fabricating an active matrix organic electroluminescent device with a thermal insulation structure comprising the following steps.

First, a substrate with a plurality of TFTs is provided, wherein each TFT comprises a semiconductor layer, a doped semiconductor layer, a gate electrode, a source electrode, and a drain electrode.

Next, an insulation layer is formed on the substrate outside the TFT.

Next, a first electrode is formed on the insulation layer.

Next, a protective layer is formed on the TFT and a part of the first electrode.

Next, an organic electroluminescent layer and a second electrode are sequentially formed over the entire surface of the substrate, substantially covering the first electrode and the protective layer, wherein the first electrode, and the organic electroluminescent layer and second electrode thereupon comprise an OLED.

Finally, the second electrode is patterned to form a thermal insulation trench between the OLED and the semiconductor layer of TFT.

According to the present invention, the thermal insulation trench can be formed by etching the second electrode. Moreover, the thermal insulation trench can be formed by etching the second electrode and the organic electroluminescent layer using the protective layer as an etch stopper.

In the present invention, the method for fabricating an active matrix organic electroluminescent device further comprises, after forming the protective layer, forming a light-shielding layer on the protective layer to cover the semiconductor layer. As well, after the formation of the thermal insulation trench, thermal insulation materials can be further filled thereinto.

A detailed description is given in the following embodiments with reference to the accompanying drawings.

BRIEF DESCRIPTION OF THE DRAWINGS

The present invention is more fully understood by reading the subsequent detailed description and examples with references made to the accompanying drawings, wherein.

The patent or application file contains at least one drawing executed in color. Copies of this patent or patent application publication with color drawing(s) will be provided by the Office upon request and payment of the necessary fee.

DETAILED DESCRIPTION OF THE INVENTION

One feature of the present invention is use of a thermal insulation structure to insulate the OLED from heat generated by the TFT under operation, resulting in high luminescent efficiency and extended lifetime of the active matrix organic electroluminescent device according to the present invention. The following embodiments are intended to illustrate the invention more fully without limiting the scope of the claims, since numerous modifications and variations will be apparent to those skilled in this art.

Figure 1:
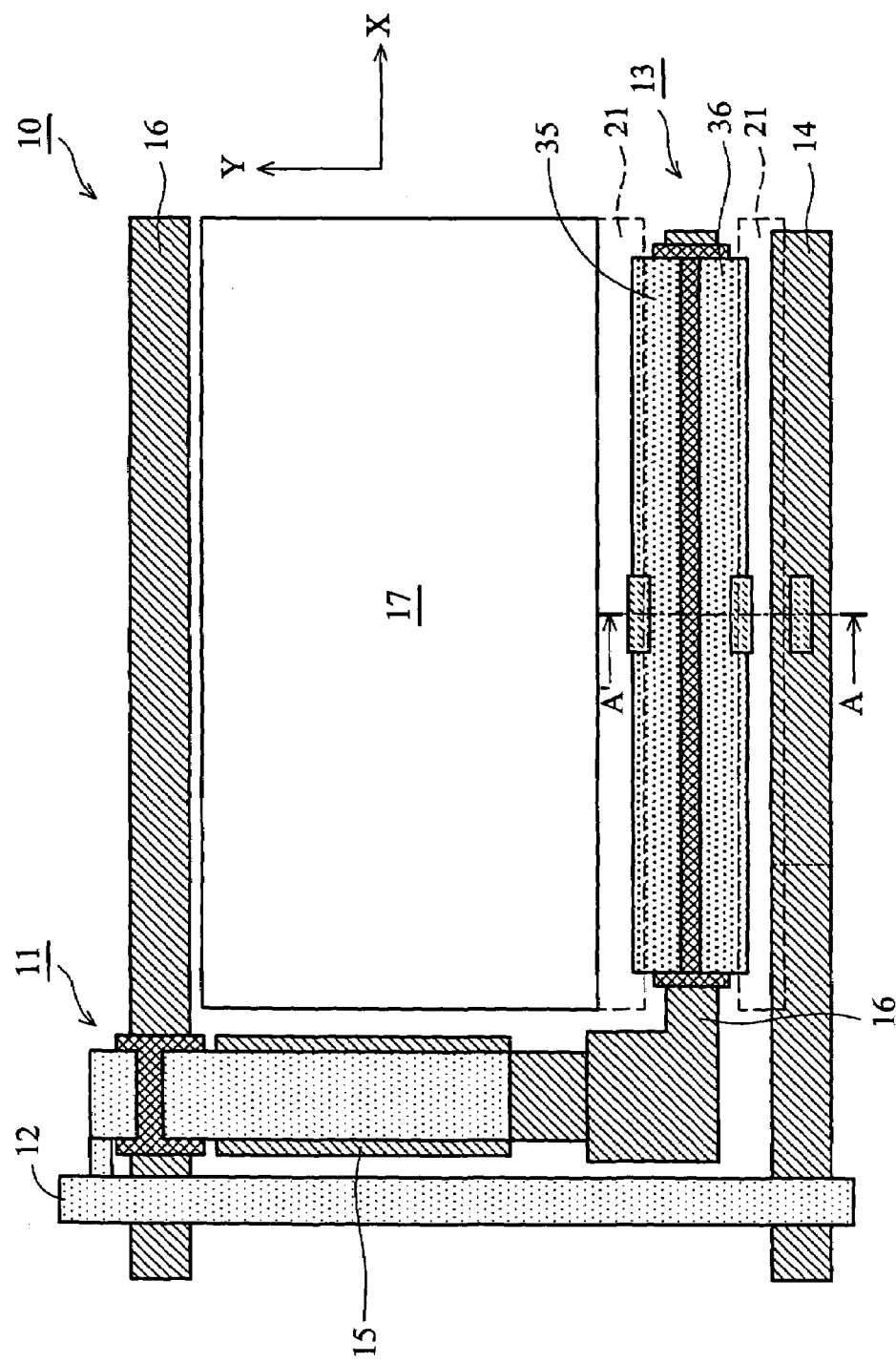
FIG. 1 is a schematic top view of a conventional active matrix organic electroluminescent device.
Figure 2:
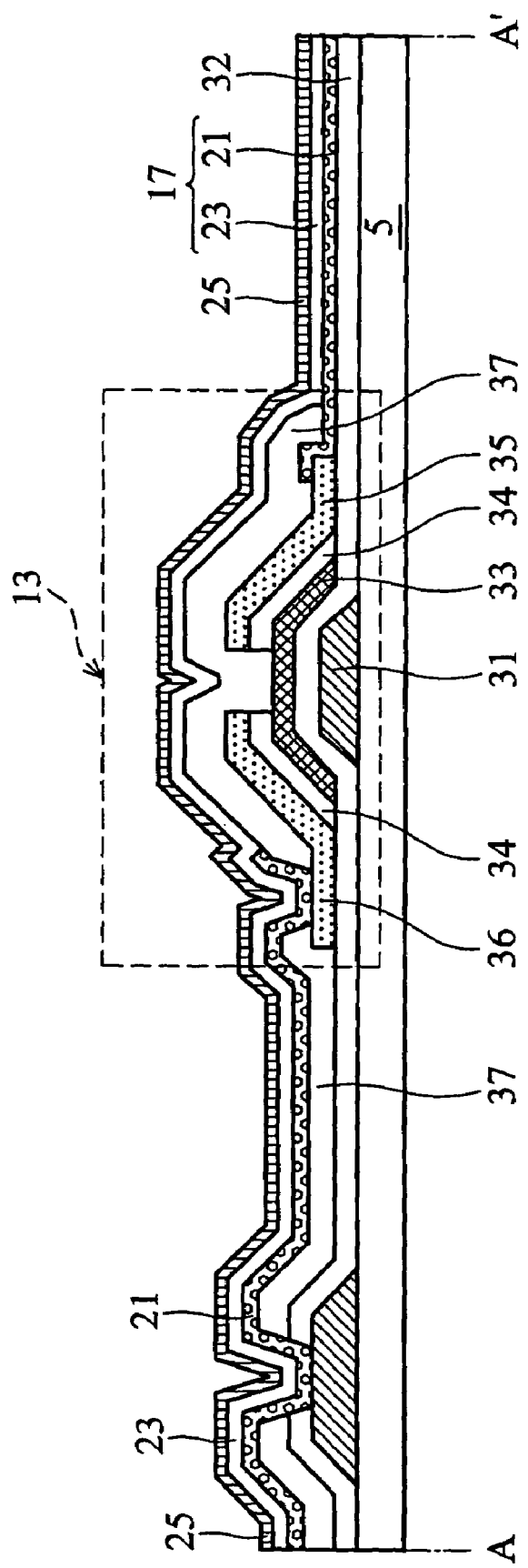
FIG. 2 is a sectional diagram of FIG. 1 along line A–A'.
Figure 3:
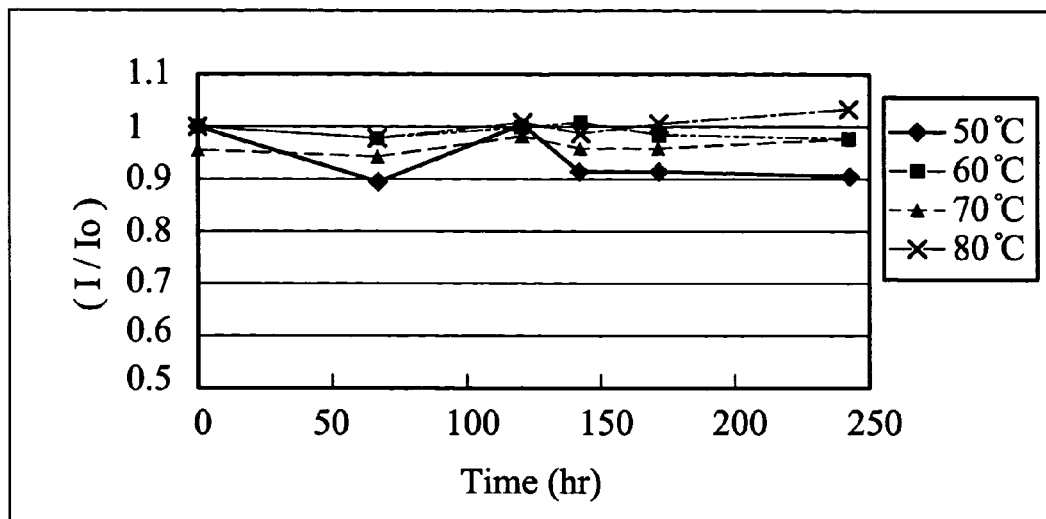
FIG. 3 is a graph plotting electrical current stability against time at different operating temperatures of a common TFT.
Figure 4:
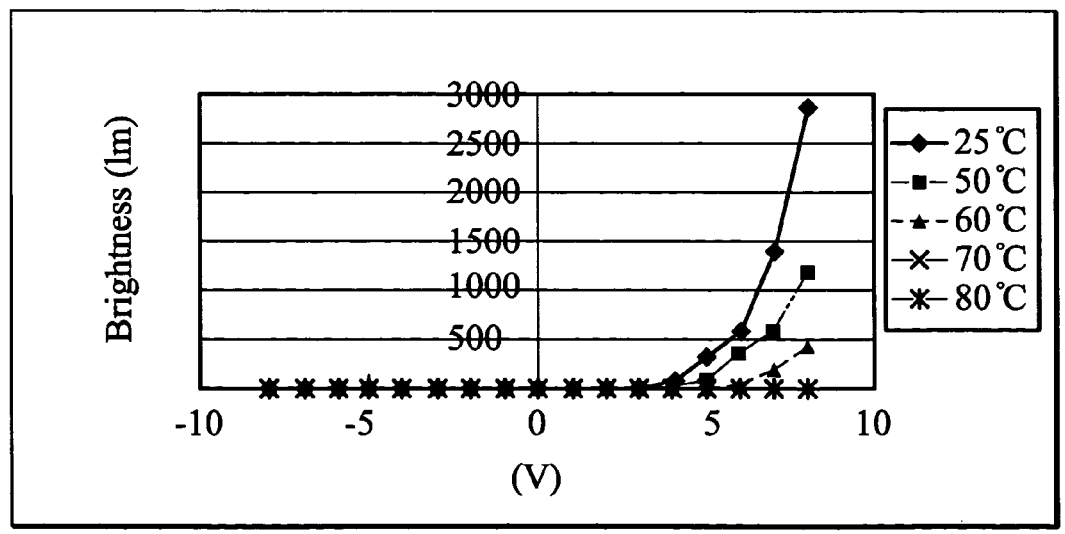
FIG. 4 is a graph plotting brightness against voltage at different operating temperatures of a common OLED.
Figure 5:
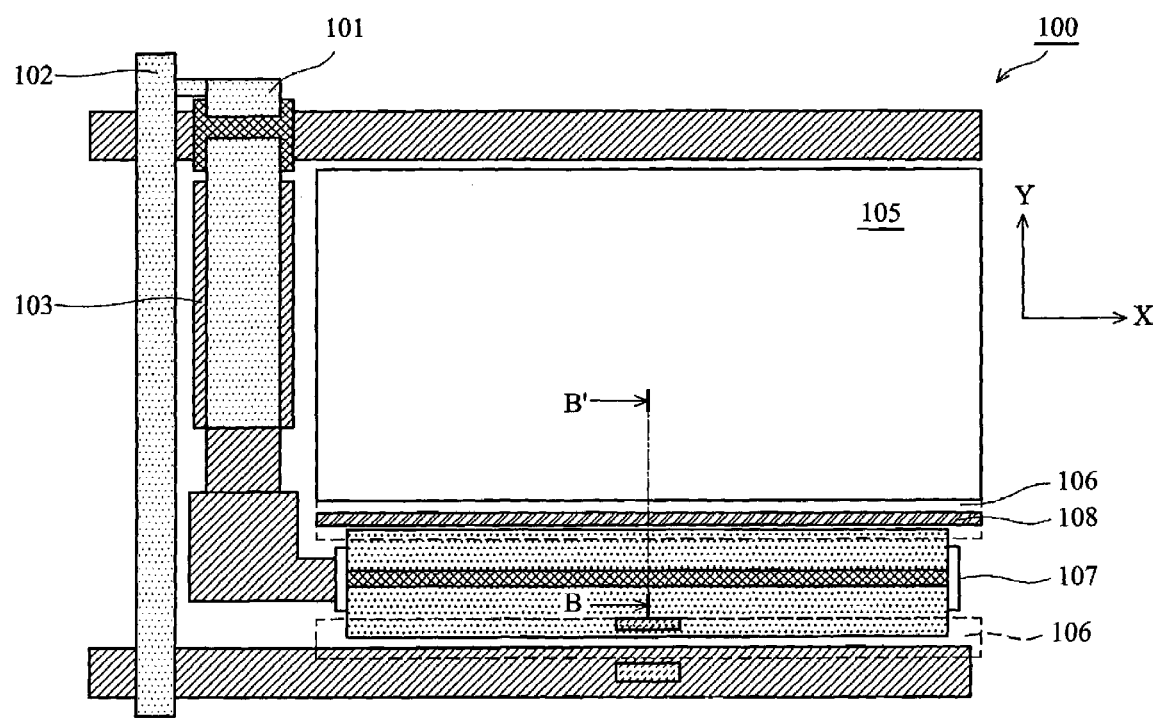
FIG. 5 is a schematic top view of an active matrix organic electroluminescent device according to the present invention.

FIG. 5 is a schematic top view of an active matrix organic electroluminescent device according to the present invention. The active matrix organic electroluminescent device comprises a plurality of pixel areas 100 arranged in a matrix form. Each pixel area 100 comprises a TFT 101 electrically connected to a data line 102 extending along a Y direction, a capacitor 103, an OLED 105, and another TFT 107 electrically connecting to the OLED 105. In the present invention, the pixel area 100 further comprises a thermal insulation structure 108 formed between the OLED 105 and the TFT 107. FIGS. 6a to 6f are sectional diagrams along line B–B' of FIG. 5 illustrating the manufacturing process of the active matrix organic electroluminescent device according to a preferred embodiment of the present invention.

Figure 6A:
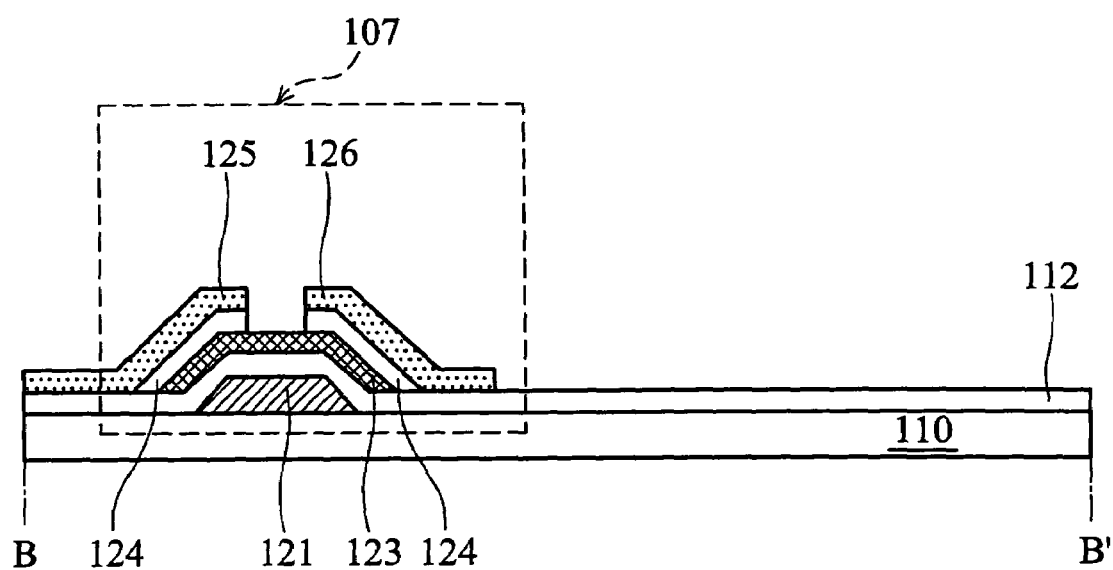
FIGS. 6a to 6f are sectional diagrams along line B–B' of FIG. 5 illustrating the manufacturing process of an active matrix organic electroluminescent device according to the present invention.

First, referring to FIG. 6a, the TFT 107 is formed on a substrate 110, and an insulation layer 112 is formed on the substrate 110 beyond the TFT 107. The TFT comprises a semiconductor layer 123, a doped semiconductor layer 124, a gate electrode 121, a source electrode 125, and a drain electrode 126. Herein, the choices for the TFT 107 are unlimited, and can be amorphous-silicon thin film transistor, low temperature poly-silicon thin film transistor (LTPS-TFT), or organic thin film transistor (OTFT). The structure of the TFT is illustrated as an example, but not intended to be limitative of the present invention. The insulation layer 112 can be a silicon nitride layer, optionally flattened by a method such as chemical mechanical polishing. Herein, the substrate 100 is a transparent insulating material such as a glass, plastic, or ceramic substrate.

Figure 6B:
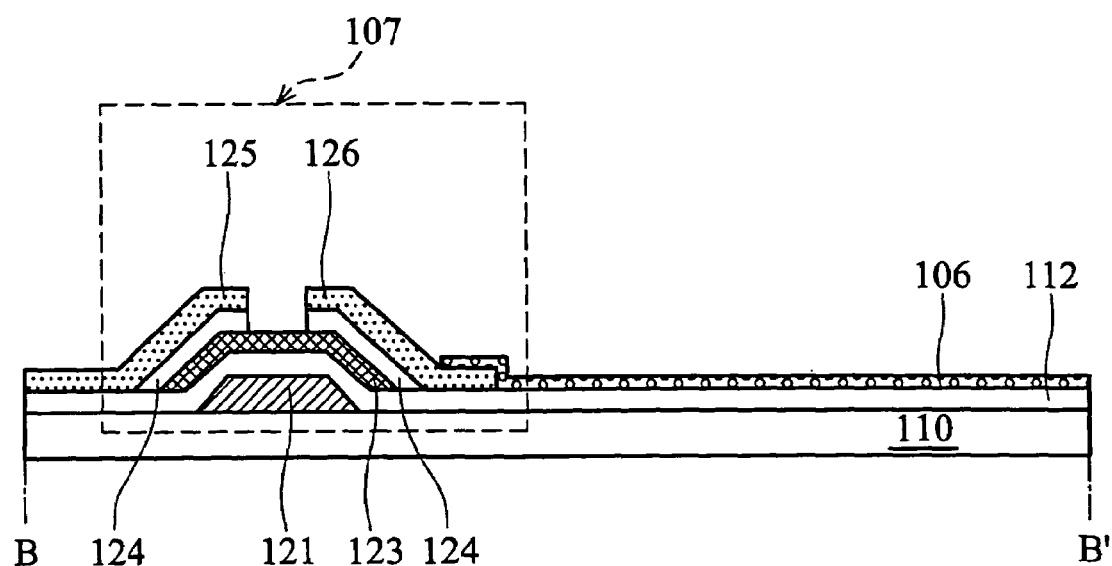

Next, referring to FIG. 6b, a transparent electrode 106, serving as the anode electrode of the OLED 105, is formed on the insulation layer 112. Suitable material for the transparent electrode 106 is transparent metal or metal oxide, such as indium tin oxide (ITO), indium zinc oxide (IZO), aluminum zinc oxide (AZO), or zinc oxide (ZnO). Preferably, the transparent electrode 106 is formed by a method such as sputtering, electron beam evaporation, thermal evaporation, or chemical vapor deposition.

Figure 6C:
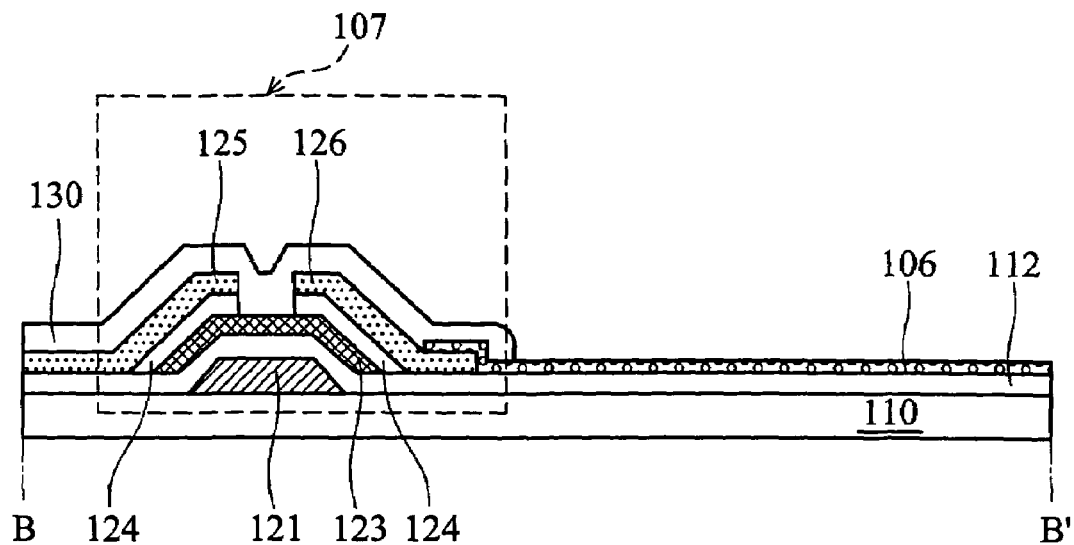

Referring to FIG. 6c, a protective layer 130 is conformally formed on the TFT 107 and a part of the transparent electrode 106 to cover the connect region of the drain electrode 126 and the transparent electrode 106. The protective layer 130 can be dielectric or organic materials. Suitable dielectric material for the protective layer 130 are insulating oxide, nitride, carbide or combinations thereof, such as silicon nitride, silicon oxide, aluminum oxide, magnesium oxide, aluminum nitride or magnesium fluoride. Suitable organic materials for the protective layer 130 are insulating organic material, such as acrylic resin, polyimide, or energy-curable resist.

Figure 6D:
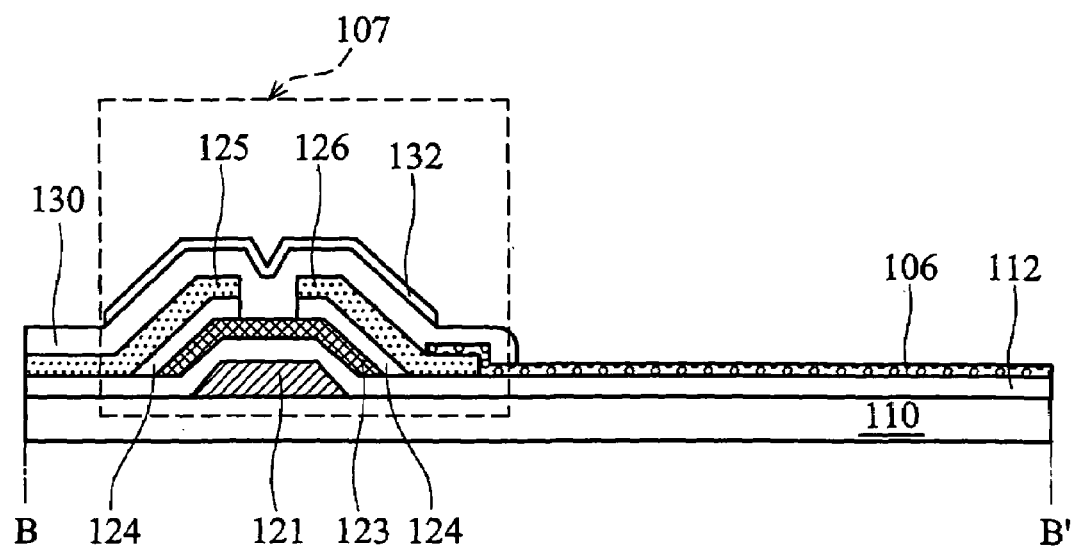

In the manufacturing process of the active matrix organic electroluminescent device, before forming an organic electroluminescent layer, the transparent electrode 106 undergoes a surface treatment with $UV/O_3$ or $O_2$ plasma to improve the performance thereof. Referring to FIG. 6d, a light-shielding layer 132 is formed on the protective layer 130 to protect the semiconductor layer 123 from damaging by $UV/O_3$ light or $O_2$ plasma. The dimensions of light-shielding layer 132 are not less than the semiconductor layer 123. Preferably, the light-shielding layer 132 is an opaque and insulating single-layered material, such as $CrO_x$, or a polymer/resin-containing and double-layered material, such as polyimide/carbon.

Figure 6E:
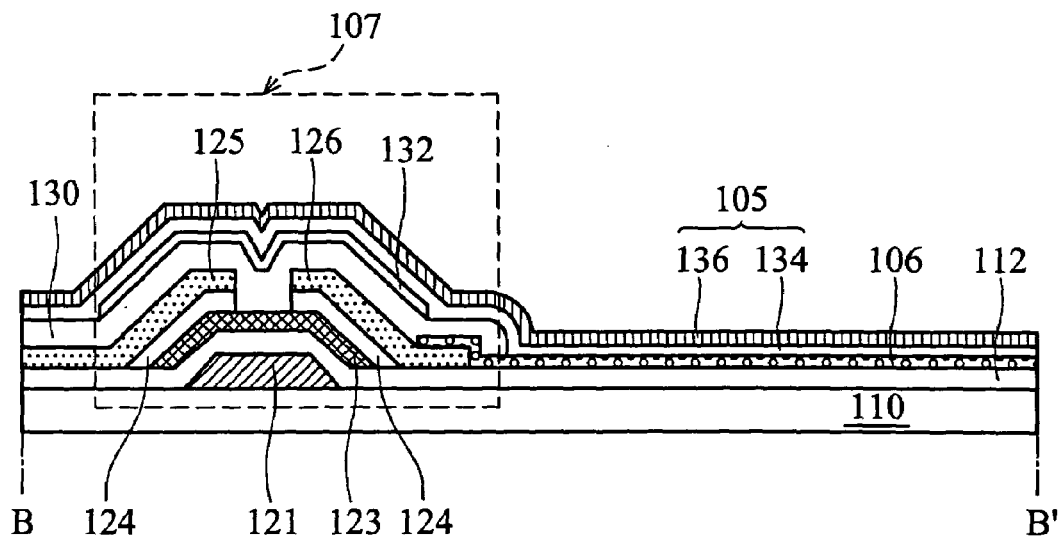

Next, referring to FIG. 6e, an organic electroluminescent layer 134 and a metal electrode 136 are sequentially formed over the entire surface of the substrate 110, substantially covering the transparent electrode 106 and the protective layer 130. The transparent electrode 106, and the organic electroluminescent layer 134 and metal electrode 136 thereupon comprise an OLED 105. Preferably, the organic electroluminescent layer 134 is organic semiconductor material, such as small molecule material, polymer, or organometallic complex and can be formed by thermal vacuum evaporation, spin coating, dip coating, roll-coating, injection-fill, embossing, stamping, physical vapor deposition, or chemical vapor deposition. The metal electrode 136 serves as the cathode electrode of the OLED 105. To meet the requirements for a cathode of OLED, material capable of injecting electrons into an organic electroluminescent layer is preferable, for example, a low work function material such as Ca, Ag, Mg, Al, Li, or alloys thereof.

Figure 6F:
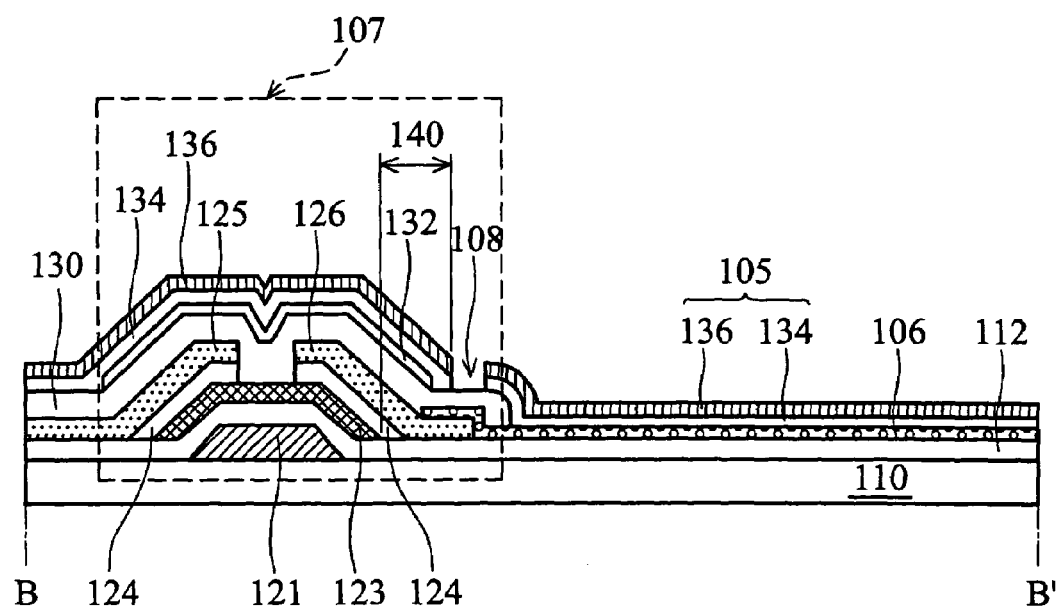

Finally, referring to FIG. 6f, the metal electrode 136 between the semiconductor layer 123 of TFT 107 and the OLED 105 is patterned to form a thermal insulation trench 108 by etching, wherein the thermal insulation trench 108 and the semiconductor layer 123 have a predetermined horizontal distance 140 therebetween. The thermal insulation trench 108 can be formed by a method comprising the following steps. First, a patterned photoresist layer is formed on the metal electrode 136 to expose a predetermined region of the thermal insulation trench 108. Next, the metal electrode 136 is etched, using the photoresist layer as a mask, with the protective layer 130 acting as an etch stopper. Moreover, the organic electroluminescent layer 134 can be simultaneously etched to form the thermal insulation trench 108 in the etching process of metal electrode 136. The etching process uses wet etching or dry etching, such as a reactive ion etching process. The predetermined horizontal distance 140 is larger than 1 nm, preferably larger than 5 nm. The thermal insulation trench 108 has a width larger than 1 μm, preferably larger than 2 μm.

Referring to FIGS. 5 and 6f, in the present invention, a part of the metal electrode 136 between the semiconductor layer 123 of TFT 107 and the OLED 105 is removed to form the thermal insulation trench 108 to protect the OLED 105 from heat generated by the TFT 107 conducting through the metal electrode 136. After forming the thermal insulation trench 108, thermal insulation materials, such as nitrogen gas, can be refilled into the thermal insulation trench 108, insulating the OLED 105 from high operating temperature. The thermal conductivity coefficient of nitrogen gas (0.0338 W/mK) is extremely low, compared to that of the metal electrode 136 such as Al electrode (237 W/mK). Therefore, the thermal insulation trench 108 and thermal insulation materials, comprising a thermal insulation structure, can efficiently protect the OLED 105 from high operating temperature.

Figure 7:
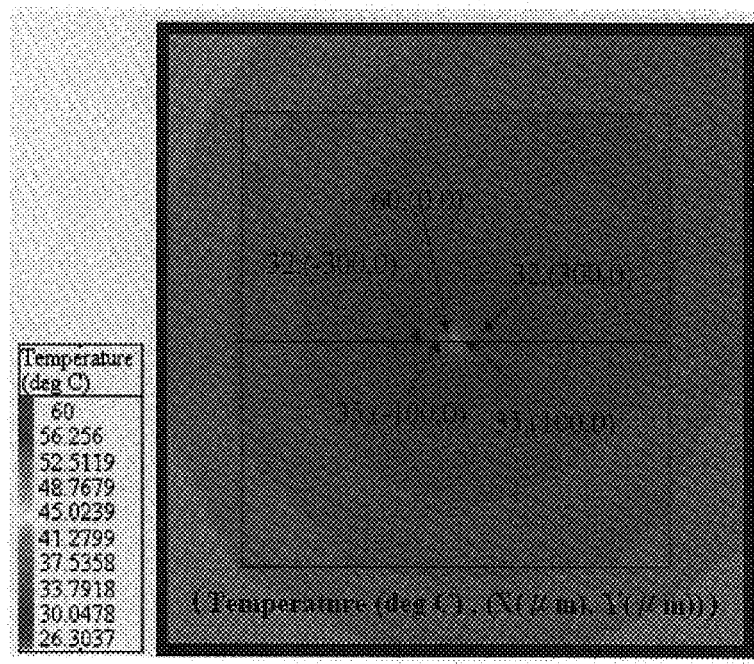
FIG. 7 is a schematic diagram of thermal distribution simulation for a conventional active matrix organic electroluminescent device using Flotheam software.
Figure 8:
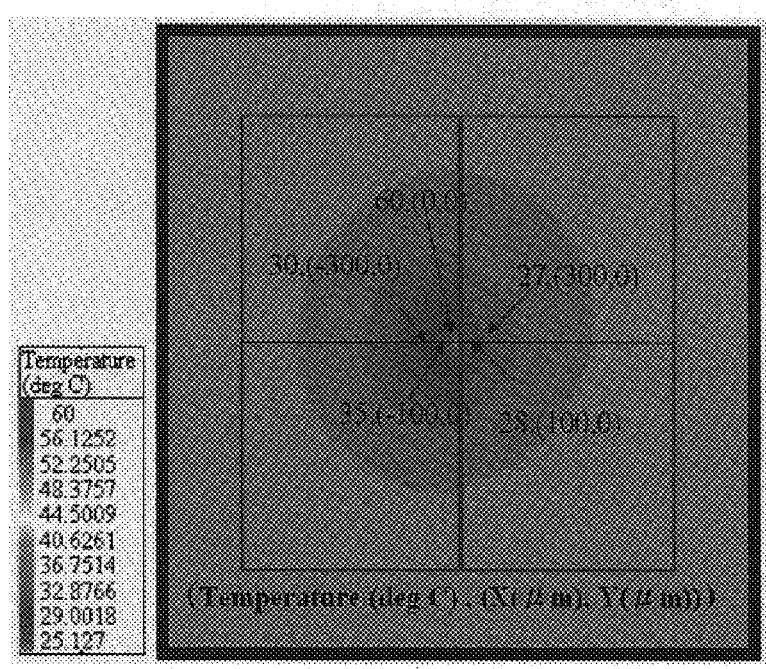
FIG. 8 is a schematic diagram of thermal distribution simulation for an active matrix organic electroluminescent device according to the present invention using Flotheam software.

FIG. 7 is a schematic diagram showing thermal distribution simulation for a conventional active matrix organic electroluminescent device using Flotheam software, and FIG. 8 a schematic diagram showing thermal distribution simulation for an active matrix organic electroluminescent device according to the present invention. The simulation configurations thereof are described as below:

Heat source size: 5 μm×5 μm
Spreader size: 5 mm×5 mm
Glass thickness: 0.7 mm
AL (second electrode) thickness: 100 μm
Thermal conductivity:
Glass: 1.4 W/m-k
AL: 170 W/m-k
Air: 0.0338 W/m-k The coordinate of the TFT acting as a heat source is (0,0), and the temperature thereof is set at 60° C. As a result, the heat generated by the TFT is not transferred through the thermal trench structure as showing in FIG. 8.

Accordingly, in the active matrix organic electroluminescent devices according to the present invention, due to the thermal insulation structure, heat generated by the TFTs is transferred to the non-luminous region of the device and the operating temperature of OLEDs is lowered, such that, compared with conventional active matrix organic electroluminescent devices, stability, luminescent efficiency, and lifetime are all significantly improved.

Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. An active matrix organic electroluminescent device, comprising a plurality of pixel areas arranged in a matrix, each pixel area comprising:
   a thin film transistor;
   an organic light-emitting diode; and
   a thermal insulation structure formed between the thin film transistor and the organic light-emitting diode.

2. The device as claimed in claim 1, wherein the thin film transistor comprises a semiconductor layer, a gate electrode, a source electrode, and a drain electrode.

3. The device as claimed in claim 2, wherein the organic light-emitting diode comprises a first electrode, an organic electroluminescent layer, and a second electrode, wherein the second electrode extends to connect with an adjacent second electrode of an adjacent organic light-emitting diode.

4. The device as claimed in claim 3, wherein the thermal insulation structure is formed in the second electrode between the thin film transistor and the organic light-emitting diode.

5. The device as claimed in claim 3, wherein the thermal insulation structure is formed in the second electrode and the organic electroluminescent layer between the thin film transistor and the organic light-emitting diode.

6. The device as claimed in claim 1, wherein the thermal insulation structure comprises a thermal insulation trench and a thermal insulation material filled into the thermal insulation trench.

7. The device as claimed in claim 6, wherein the thermal insulation material is nitrogen gas.

8. The device as claimed in claim 6, wherein the thermal insulation trench has a width larger than 1 nm.

9. The device as claimed in claim 1, wherein the thin film transistor comprises an amorphous-silicon thin film transistor, low temperature poly-silicon thin film transistor, or organic thin film transistor.

10. An active matrix organic electroluminescent device, comprising a plurality of pixel areas arranged in a matrix, each pixel area comprising:
a thin film transistor and an insulation layer formed on a substrate, wherein the thin film transistor comprises a semiconductor layer, a doped semiconductor layer, a gate electrode, a source electrode, and a drain electrode;
a first electrode formed on the insulation layer;
a protective layer formed on the thin film transistor and a part of the first electrode;
an organic electroluminescent layer and a second electrode sequentially formed over the entire surface of the substrate, substantially covering the first electrode and the protective layer, wherein the first electrode, and the organic electroluminescent layer and second electrode thereupon comprise an organic light-emitting diode; and
a thermal insulation structure formed between the semiconductor layer and the organic light-emitting diode.

11. The device as claimed in claim 10, wherein the thermal insulation structure is formed in the second electrode and the organic electroluminescent layer between the thin film transistor and the organic light-emitting diode.

12. The device as claimed in claim 10, further comprising a light-shielding layer formed on the protective layer to cover the semiconductor layer.

13. The device as claimed in claim 10, wherein the thermal insulation structure comprises a thermal insulation trench and a thermal insulation material filled into the thermal insulation trench.

14. The device as claimed in claim 13, wherein the thermal insulation material is nitrogen gas.

15. The device as claimed in claim 13, wherein the thermal insulation trench has a width larger than 1 nm.

16. The device as claimed in claim 10, wherein the thin film transistor comprises an amorphous-silicon thin film transistor, low temperature poly-silicon thin film transistor, or organic thin film transistor.

17. A method of fabricating an active matrix organic electroluminescent device, comprising:
providing a substrate;
forming a plurality of thin film transistors on the substrate, wherein the thin film transistor comprises a semiconductor layer, a doped semiconductor layer, a gate electrode, a source electrode, and a drain electrode;
forming an insulation layer on the substrate;
forming a first electrode on the insulation layer;
forming a protective layer on the thin film transistors and a part of the first electrode;
sequentially forming an organic electroluminescent layer and a second electrode over the entire surface of the substrate, substantially covering the first electrode and the protective layer, wherein the first electrode, and the organic electroluminescent layer and second electrode thereupon comprise an organic light-emitting diode; and
patterning the second electrode, between the semiconductor layer and the organic light-emitting diode to form a thermal insulation trench.

18. The method as claimed in claim 17, further comprising, after forming the protective layer, forming a light-shielding layer on the protective layer to cover the semiconductor layer.

19. The method as claimed in claim 17, wherein the thermal insulation trench is formed by etching the second electrode and the organic electroluminescent layer with the protective layer acting as an etch stopper.

20. The method as claimed in claim 17, further comprising, after forming the thermal insulation trench, refilling a thermal insulation material into the thermal insulation trench.

21. The method as claimed in claim 17, wherein the thermal insulation trench has a width larger than 1 nm.

* * * * *